United States Patent
Kurihara et al.

(10) Patent No.: US 12,306,130 B2
(45) Date of Patent: May 20, 2025

(54) ELECTROCHEMICAL SENSOR UNIT, ELECTRODE FOR ELECTROCHEMICAL SENSOR, AND METHOD OF MANUFACTURING ELECTRODE FOR ELECTROCHEMICAL SENSOR

(71) Applicant: SUMITOMO CHEMICAL COMPANY, LIMITED, Tokyo (JP)

(72) Inventors: Kaori Kurihara, Hitachi (JP); Yohei Otoki, Hitachi (JP); Fumimasa Horikiri, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 658 days.

(21) Appl. No.: 17/628,037

(22) PCT Filed: Jul. 15, 2020

(86) PCT No.: PCT/JP2020/027464
§ 371 (c)(1),
(2) Date: Jan. 18, 2022

(87) PCT Pub. No.: WO2021/015067
PCT Pub. Date: Jan. 28, 2021

(65) Prior Publication Data
US 2022/0260516 A1    Aug. 18, 2022

(30) Foreign Application Priority Data
Jul. 19, 2019  (JP) .................................. 2019-133226

(51) Int. Cl.
*G01N 27/30* (2006.01)
*C23C 16/27* (2006.01)
*G01N 27/403* (2006.01)

(52) U.S. Cl.
CPC .......... *G01N 27/308* (2013.01); *C23C 16/271* (2013.01); *G01N 27/403* (2013.01)

(58) Field of Classification Search
CPC .... G01N 27/307; G01N 27/48; G01N 27/308; G01N 27/403; H04L 12/40052;
(Continued)

(56) References Cited

U.S. PATENT DOCUMENTS

2004/0146779 A1    7/2004  Haenni et al.
2006/0175953 A1*   8/2006  Swain .................. C25B 11/073
                                                      313/311
(Continued)

FOREIGN PATENT DOCUMENTS

JP    2004-101437 A    4/2004
JP    2004-525765 A    8/2004
(Continued)

OTHER PUBLICATIONS

English Machine Translation of RU2357001 (Year: 2007).*
(Continued)

*Primary Examiner* — Gurpreet Kaur
(74) *Attorney, Agent, or Firm* — Foley & Lardner LLP

(57) ABSTRACT

An electrochemical sensor unit including: a working electrode; and a counter electrode, wherein the working electrode includes a diamond film which generates a redox reaction on a surface when a voltage is applied between the working electrode and the counter electrode, and a support which is formed of a material different from diamond and supports the diamond film, when the working electrode is viewed laterally, in the support, a width of a surface opposite to a surface in contact with the diamond film is smaller than a width of the diamond film, and a liquid test sample is supplied to the working electrode from the diamond film side.

10 Claims, 5 Drawing Sheets

(58) Field of Classification Search
CPC ..... H04L 12/0097; H04L 12/64; H04L 12/66; C23C 16/271
See application file for complete search history.

(56) References Cited

U.S. PATENT DOCUMENTS

| | | | |
|---|---|---|---|
| 2011/0247929 A1* | 10/2011 | Nagai | C23C 16/271 174/126.1 |
| 2013/0327640 A1 | 12/2013 | Mollart et al. | |
| 2015/0204805 A1 | 7/2015 | Newton et al. | |
| 2015/0330929 A1 | 11/2015 | Einaga et al. | |

FOREIGN PATENT DOCUMENTS

| | | | |
|---|---|---|---|
| JP | 2006-249552 A | | 9/2006 |
| JP | 2007-292717 A | | 11/2007 |
| JP | 2013-208259 A | | 10/2013 |
| JP | 2014-508943 A | | 4/2014 |
| JP | 2015-524930 A | | 8/2015 |
| RU | 2357001 C2 | * | 5/2009 |
| WO | WO-01/98766 A1 | | 12/2001 |
| WO | WO-2007/116978 A1 | | 10/2007 |
| WO | WO-2014/077017 A1 | | 5/2014 |

OTHER PUBLICATIONS

International Searching Authority, "International Search Report," issued in connection with International Patent Application No. PCT/JP2020/027464, dated Sep. 8, 2020.

International Searching Authority, "Written Opinion," Issued in connection with International Patent Application No. PCT/JP2020/027464, dated Sep. 8, 2020.

Extended European Search Report issued in corresponding European Patent Application No. 20843662.6, dated Jun. 14, 2023.

John H. T. Luong et al: "Boron-doped diamond electrode: synthesis, characterization, functionalization and analytical applications", The Analyst, vol. 134, No. 10, (Aug. 7, 2009), p. 1965, XP055029859, ISSN: 0003-2654, DOI: 10.1039/b910206j.

Lim P Y et al: "Improved stability of titanium based boron-doped chemical vapor deposited diamond thin-film electrode by modifying titanium substrate surface", Thin Solid Films, Elsevier, Amsterdam, NL, vol. 516, No. 18 (Jul. 31, 2008), pp. 6125-6132, XP022705232, ISSN: 0040-6090, DOI: 10.1016/J.TS.11.016.

International Preliminary Report on Patentability received in International Application No. PCT/JP2020/027464 on Jan. 25, 2022, (5 pages).

* cited by examiner

ELECTROCHEMICAL SENSOR UNIT, ELECTRODE FOR ELECTROCHEMICAL SENSOR, AND METHOD OF MANUFACTURING ELECTRODE FOR ELECTROCHEMICAL SENSOR

CROSS-REFERENCE TO RELATED APPLICATIONS

The present application claims priority under 37 U.S.C. § 371 to International Patent Application No. PCT/JP2020/027464, filed Jul. 15, 2020, which claims priority to and the benefit of Japanese Patent Application No. 2019-133226, filed on Jul. 19, 2019. The contents of these applications are hereby incorporated by reference in their entireties.

TECHNICAL FIELD

The present disclosure relates to an electrochemical sensor unit, an electrode for electrochemical sensor, and a method of manufacturing an electrode for electrochemical sensor.

DESCRIPTION OF THE RELATED ART

Recently, it is proposed to use an electrode including a diamond film as a working electrode for an electrochemical sensor unit. Since conductive diamond has a wide potential window and a small background current, it enables electrochemical detection of various substances with high sensitivity. Therefore, conductive diamond is attracting attention as a material for the electrode for electrochemical sensor.

PRIOR ART DOCUMENT

Patent Document

Patent Document 1: Japanese Patent Laid-Open Publication No. 2007-292717
Patent Document 2: Japanese Patent Laid-Open Publication No. 2013-208259

SUMMARY

Problems to be Solved by the Disclosure

An object of the present disclosure is to further improve a sensor performance of an electrochemical sensor unit including an electrode for electrochemical sensor, the electrode including a diamond film.

Means for Solving the Problem

According to an aspect of the present disclosure, there is provided an electrochemical sensor unit and a related technique thereof, including:
a working electrode; and
a counter electrode,
wherein the working electrode includes a diamond film which generates a redox reaction on a surface when a voltage is applied between the working electrode and the counter electrode, and a support which is formed of a material different from diamond and supports the diamond film,
when the working electrode is viewed laterally, in the support, a width of a surface opposite to a surface in contact with the diamond film is smaller than a width of the diamond film, and a liquid test sample is supplied to the working electrode from a diamond film side.

Advantage of the Disclosure

According to the present disclosure, it is possible to further improve a sensor performance of an electrochemical sensor unit including an electrode for electrochemical sensor, the electrode including a diamond film.

DETAILED DESCRIPTION

An Embodiment of the Present Disclosure

Figure 1:
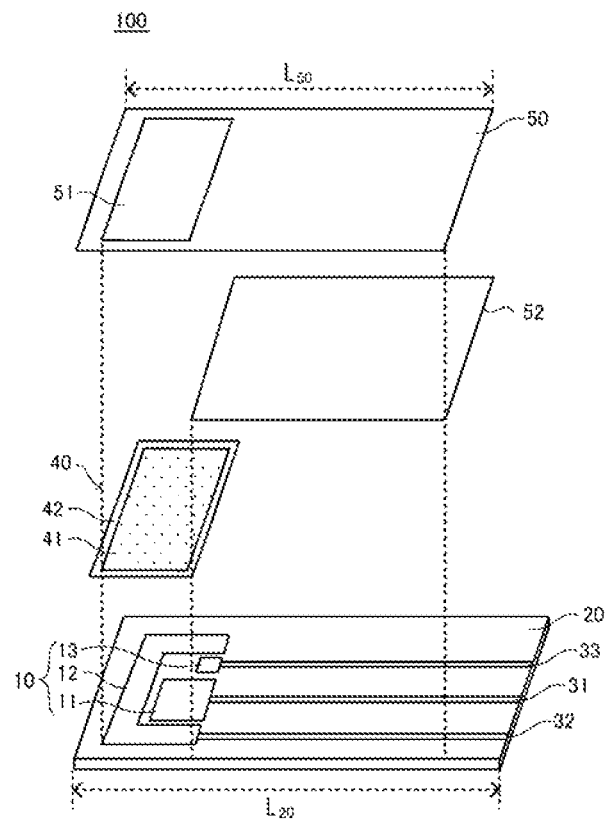
FIG. 1 is a view illustrating an example of an exploded perspective view of an electrochemical sensor unit according to an embodiment of the present disclosure.

Explanation will be hereafter given for an electrochemical sensor unit which measures a concentration of a predetermined component in a liquid test sample by a three-electrode method as an embodiment of the present disclosure, with reference to FIG. 1. In the present embodiment, explanation will be given for an example of the electrochemical sensor unit which measures a uric acid concentration in urine by the three-electrode method.

(1) Configuration of Electrochemical Sensor Unit

As illustrated in FIG. 1, an electrochemical sensor unit 100 (hereafter also referred to as "sensor 100") according to the present embodiment includes: an electrode group 10 constituted by a working electrode 11, a counter electrode 12, and a reference electrode 13; a support member 20 which supports the electrode group 10; first to third wirings 31 to 33 connected to the working electrode 11, the counter electrode 12, and the reference electrode 13, respectively; a water absorption member 40 arranged so as to cover the electrode group 10; and a waterproof member 50 arranged so as to cover (a part of) the first to third wirings 31 to 33. The sensor 100 is configured to be disposable, for example.

The working electrode 11 includes a diamond film which generates on a surface thereof a redox reaction (electrochemical reaction) of a predetermined component (e.g., uric acid) in urine when applying a predetermined voltage between the working electrode 11 and the counter electrode 12, both being in contact with a liquid test sample (e.g., urine), for example, using a measurement mechanism including a voltage applicator mentioned later. The details of the working electrode 11 will be mentioned later.

The counter electrode 12 is an electrode for flowing a current generated by the above-mentioned redox reaction to the working electrode 11. As the counter electrode 12, an electrode formed of metal such as platinum (Pt), gold (Au), copper (Cu), palladium (Pd), nickel (Ni), or silver (Ag), a carbon electrode, or the like can be used.

The reference electrode 13 is an electrode used as a basis for determining a potential of the working electrode 11. As the reference electrode 13, for example, a silver/silver chloride (Ag/AgCl) electrode can be used. As the reference electrode 13, a standard hydrogen electrode, a reversible hydrogen electrode, a palladium-hydrogen electrode, a saturated calomel electrode, or the like can also be used. As the reference electrode 13, an electrode formed of metal such as Pt, Au, Cu, Pd, Ni, or Ag, a carbon electrode, or the like can be used.

In the present specification, the working electrode 11, the counter electrode 12, and the reference electrode 13 are collectively referred to as the electrode group 10 in some cases.

The sensor 100 includes the support member 20 which supports the electrode group 10. The electrode group 10 is arranged on the same surface of the support member 20. The support member 20 is configured as a sheet-like (plate-like) base material, and has a size and shape (e.g., a rectangular (strip-like) planar shape) that is easy-to-handle (e.g., easy for a subject to grasp). The support member 20 may include a longitudinal part (main part) and a convex part (a part connected to a measurement mechanism mentioned later). The support member 20 has such a physical (mechanical) strength that it can be used as the sensor 100. For example, the support member 20 has such a strength that it does not bend nor break even when a test sample is attached thereto. The support member 20 can be formed of insulating materials such as insulating composite resin, ceramic, glass, plastic, flammable materials, biodegradable materials, non-woven fabric, or paper. The support member 20 is preferably a flexible base material. As the support member 20, for example, a base material formed of glass epoxy resin or polyethylene terephthalate (PET) can be suitably used. As the support member 20, a semiconductor base material or a metal base material can also be used which is configured so that its surface supporting the electrode group 10 has an insulating property. The support member 20 (the longitudinal part thereof) may have a thickness of, for example, 200 μm or more and 1 mm or less, a width of, for example, 6 mm or more and 12 mm or less, and a length of, for example, 95 mm or more and 115 mm or less. In the support member 20 having the convex part, the convex part may have a length of, for example, 5 mm or more and 15 mm or less, and a width of 2 mm to 4 mm narrower than the width of the longitudinal part of the support member 20.

One end of the first wiring (conductor wiring) 31 is connected to the working electrode 11, one end of the second wiring (conductor wiring) 32 is connected to the counter electrode 12, and one end of the third wiring (conductor wiring) 33 is connected to the reference electrode 13. The first wiring 31 is electrically connected to the working electrode 11 via an anisotropic conductive film such as an ACF-film, a conductive paste such as a solder, metal, or the like. The second wiring 32 and the counter electrode 12 are integrally formed of the same material, and the third wiring 33 and the reference electrode 13 are integrally formed of the same material. The second wiring 32 and the counter electrode 12 may be formed of different materials, and the third wiring 33 and the reference electrode 13 may be formed of different materials. In this case, the second and third wirings 32, 33 can be electrically connected to the counter electrode 12 and the reference electrode 13, respectively, via an anisotropic conductive film, a conductive paste, or metal, similarly to the first wiring 31.

Each of the first to third wirings 31 to 33 is arranged on the same surface as the surface of the support member 20 on which the electrode group 10 is arranged. Each of the first to third wirings 31 to 33 is preferably arranged so as to reach one end of the support member 20. Each of the first to third wirings 31 to 33 can be formed, for example, using Cu. Each of the first to third wirings 31 to 33 can be formed using, in place of Cu, a noble metal such as Au, Pt, Ag, or Pd; a metal such as aluminum (Al), iron (Fe), Ni, chromium (Cr), or titanium (Ti); an oxide of the above-mentioned noble metal or metal such as an alloy mainly containing the noble metal or metal; or the like. Each of the first to third wirings 31 to 33 can also be formed using carbon. Each of the first to third wirings 31 to 33 can be formed, for example, by a subtractive method in which an unnecessary part, not covered with resist, of a noble metal or metal film (e.g., Cu-film) previously adhered onto the support member 20 is removed by etching to form a necessary conductor pattern. For each of the first to third wirings 31 to 33, the conductor pattern formed by the subtractive method may be, for example, Au-plated or Ag-plated. Each of the first to third wirings 31 to 33 can be formed, for example, by a printing method, a vapor deposition method, or the like. An exemplary printing method is a screen printing method, a gravure printing method, an offset printing method, or an inkjet printing.

The sensor 100 includes the water absorption member 40 that absorbs and retains a supplied urine while bringing the retained urine into contact with a surface of the electrode group 10. The water absorption member 40 is formed, for example, in a form of a sheet. The water absorption member 40 may have a thickness of, for example, 0.01 mm or more and 0.3 mm or less.

The water absorption member 40 is arranged on the support member 20 so as to cover the electrode group 10. The water absorption member 40 is arranged so as to come into contact with the surface of the electrode group 10 when the water absorption member 40 absorbs urine. The water absorption member 40 with no urine absorbed therein does not have to be in contact with the surface of the electrode group 10. The water absorption member 40 is preferably arranged so as to prevent the absorbed urine from coming into contact with the first to third wirings 31 to 33.

The water absorption member 40 has an absorption region 41 that absorbs and retains urine, at a position corresponding to the electrode group 10 when the water absorption member 40 is arranged. The water absorption member 40 preferably has a non-absorption region 42 that does not absorb urine and is provided so as to surround the absorption region 41. Thereby, excess urine that is not in contact with the electrode group 10 can be prevented from soaking into the water absorption member 40. Also, urine can be reliably prevented from coming into contact with the first to third wirings 31 to 33 through the water absorption member 40. An entirety of the water absorption member 40 may be the absorption region 41, as long as the water absorption member 40 is configured (arranged) so as to bring the absorbed urine into contact with the surface of the electrode group 10 while preventing the absorbed urine from coming into contact with the first to third wirings 31 to 33.

The absorption region 41 can be formed, for example, using a natural fiber, a pulp fiber, a regenerated fiber, or a synthetic fiber. Specifically, the absorption region 41 can be formed using a filter paper, a membrane filter, a glass filter, a filter cloth, or the like. The absorption region 41 can also be formed by letting an aggregate comprising the above-mentioned one or more fibers retain water-absorbing polymer grains or the like. The absorption region 41 may also be formed using a porous material such as a sponge or diatomaceous earth, a fiber material such as a non-woven fabric, or the like.

The non-absorption region 42 can be formed of a water repellent or water-impermeable material. The non-absorption region 42 can be formed, for example, using plastic, silicon resin, Teflon (registered trademark) resin, or rubber.

The sensor 100 includes the waterproof member 50 which prevents urine from contacting with the first to third wirings 31 to 33. The waterproof member 50 is formed, for example, in a form of a sheet. The waterproof member 50 is provided on the same surface as the surface of the support member 20 on which the electrode group 10 is arranged, so as to cover (a part of) the first to third wirings 31 to 33. The waterproof member 50 may have a thickness of, for example, 0.01 mm or more and 0.3 mm or less.

The waterproof member 50 is configured, for example, so as to expose (the absorption region 41 of) the water absorption member 40 located on the electrode group 10. For example, the waterproof member 50 has an opening 51 formed at a position corresponding to at least the absorption region 41 when the waterproof member 50 is arranged.

Further, the waterproof member 50 is configured as follows: of the two ends of the first to third wirings 31 to 33, each of the other ends, different from the one ends respectively connected to the working electrode 11, the counter electrode 12, and the reference electrode 13, is exposed at one end of the support member 20. For example, the waterproof member 50 is formed so that its longitudinal length $L_{50}$ is shorter than a longitudinal length $L_{20}$ of the support member 20 ($L_{50} < L_{20}$). In a measurement of the uric acid concentration using the sensor 100, a connector of the measurement mechanism configured separately from the sensor 100 is connected to the exposed other ends of the first to third wirings 31 to 33. The other ends of the first to third wirings 31 to 33 are exposed so as to be covered with (the connector of) the measurement mechanism when the above-mentioned connector of the measurement mechanism is connected to the other ends of the first to third wirings 31 to 33.

As mentioned above, the waterproof member 50 is configured so as to cover a predetermined region of the surface of the support member 20 on which the electrode group 10 is arranged. Such a predetermined region is a region except for a region for allowing the water absorption member 40 located on the electrode group 10 to be exposed, and also is a region with which urine can come into contact in a state where the connector is connected (e.g., in a nip state of the measurement mechanism).

The waterproof member 50 is preferably formed of a water-impermeable and insulating material, from a viewpoint of preventing urine from contacting with the first to third wirings 31 to 33. For example, the waterproof member 50 can be formed using plastic, silicon resin, Teflon (registered trademark) resin, rubber, or the like.

A waterproof member 52 may be provided between the waterproof member 50 and the first to third wirings 31 to 33 to prevent urine from contacting with the first to third wirings 31 to 33. The waterproof member 52 is formed in a form of a film, for example, using a material similar to that of the waterproof member 50. The waterproof member 52 is provided on the support member 20 so as to cover a region other than exposed parts of the first to third wirings 31 to 33, that is, to seal a region other than the exposed parts of the first to third wirings 31 to 33. Thereby, urine can be reliably prevented from contacting with the first to third wirings 31 to 33. The waterproof member 52 is preferably provided so as to cover the region other than the exposed parts of the first to the third wirings 31 to 33, but may be provided so as to cover at least a region other than the exposed part of the first wiring 31. The waterproof member 52 does not have to be provided so long as the non-absorption region 42 of the water absorption member 40 and the waterproof member 50 can reliably prevent urine from contacting with the first to third wirings 31 to 33.

(2) Method of Measuring Uric Acid Concentration Using Electrochemical Sensor Unit Explanation will be given for a method of measuring the uric acid concentration in urine by performing an electrochemical measurement using the above-mentioned electrochemical sensor unit 100.

The method of measuring the uric acid concentration using the electrochemical sensor unit 100 includes:
supplying urine to the electrode group 10 through the water absorption member 40 after the connector of the measurement mechanism is connected to the other ends of the first to third wirings 31 to 33 (Step 1);
applying a voltage between the working electrode 11 and the counter electrode 12 while urine is in contact with the surface of the electrode group 10 to generate a redox reaction (electrochemical reaction) of uric acid on a surface of the diamond film included in the working electrode 11, and measuring a current value generated by the redox reaction of uric acid (Step 2);
measuring a potential difference (voltage difference) between the working electrode 11 and the reference electrode 13 while urine is in contact with the surface of the electrode group 10 (Step 3); and
determining the uric acid concentration based on the measured current value and the potential difference (Step 4).

(Step 1)

The connector of the measurement mechanism configured separately from the sensor 100 is connected to the other ends of the first to third wirings 31 to 33 of the sensor 100 (to parts of the first to third wirings 31 to 33, which are exposed from the waterproof member 50). The measurement mechanism is configured so as to electrically connect the connector of the measurement mechanism and the first to third wirings 31 to 33 by simply nipping the other ends of the first to third wirings 31 to 33 together with the support member 20. The measurement mechanism may also be configured to have an inserting opening (slot) through which the other ends of the first to third wirings 31 to 33 (convex parts) are inserted, and to electrically connect the connector of the measurement mechanism and the first to third wirings 31 to 33 by simply inserting the other ends of the first to third wirings 31 to 33 (convex parts) into the inserting opening.

The measurement mechanism includes a voltage applicator, an amperemeter, a potentiometer, a potential adjustor, a uric acid concentration calculator, a display, a wireless communicator, and a storage. The voltage applicator, the amperemeter, the potentiometer, the potential adjustor, the uric acid concentration calculator, the display, the wireless communicator, and the storage, included in the measurement mechanism, are connected to each other so as to enable mutual data exchange. The voltage applicator is configured so as to apply a voltage between the working electrode 11 and the counter electrode 12 when a predetermined circuit is formed by connecting the connector to the other ends of the first to third wirings 31 to 33. The amperemeter is configured so as to measure a current generated by the redox reaction of uric acid. The potentiometer is configured so as to measure the potential difference (voltage difference) between the working electrode 11 and the reference electrode 13. The potential adjustor is configured so as to keep a potential of the working electrode 11 constant with reference to a potential of the reference electrode 13, based on the potential difference measured with the potentiometer. The uric acid concentration calculator is configured so as to calculate (determine) the uric acid concentration, based on the current value measured with the amperemeter. The display is configured so as to display the uric acid concentration calculated with the uric acid concentration calculator. The wireless communicator is configured so as to transmit data such as a measured current value, or a calculated uric acid concentration to an external device (computer, etc.) which is wirelessly connected. The storage stores a program or the like that describes a voltage application procedure, a current value measurement procedure, a potential adjustment procedure, a uric acid concentration calculation procedure, a uric acid concentration display procedure, a data transmission procedure, or the like. By executing the program, each of the above-mentioned procedure can be executed. The measurement mechanism may be configured so as to store the measured current value, the calculated uric acid concentration, and the like in the storage.

After the measurement mechanism is connected to the sensor 100, urine is supplied to the sensor 100. For example, a subject urinates onto the opening 51 of the waterproof member 50 of the sensor 100 (the water absorption member 40 exposed through the opening 51 of the waterproof member 50).

(Step 2)

When urine is supplied to the sensor 100, the urine is absorbed by the water absorption member 40. The urine absorbed by the water absorption member 40 penetrates the absorption region 41 of the water absorption member 40 and reaches the surface of the electrode group 10, and the urine comes into contact with the surface of the electrode group 10.

By applying a voltage between the working electrode 11 and the counter electrode 12 using the measurement mechanism while the urine is in contact with the surface of the electrode group 10, the redox reaction of uric acid is generated on the surface of the diamond film included in the working electrode 11. The generation of the redox reaction of uric acid causes a current (hereafter also referred to as "reaction current") to flow through the working electrode 11. The reaction current value is measured, for example, by cyclic voltammetry using the measurement mechanism. An exemplary cyclic voltammetry condition is as follows: Voltage range, 0 to 1 V; Sweep speed, 0.1 to 1 V/s. The reaction current value may be measured by a method such as square wave voltammetry (rectangular-wave voltammetry), differential pulse voltammetry, normal pulse voltammetry, or AC-voltammetry. The measured reaction current value may be transmitted via the wireless communicator to an external device configured as a computer.

(Step 3)

The potential difference (voltage difference) between the working electrode 11 and the reference electrode 13 during the above-mentioned step 2, is measured using the measurement mechanism.

(Step 4)

For example, a cyclic voltammogram is obtained using the reaction current values measured in step 2, to obtain an oxidation peak current value. The uric acid concentration is calculated (determined) using the measurement mechanism, based on the obtained oxidation peak current value and the potential difference value measured in step 3. The present inventors confirmed that the reaction current value is correlated with the uric acid concentration in urine. Therefore, by obtaining a relationship between the reaction current value and the uric acid concentration in advance, the uric acid concentration can be determined based on the measured reaction current value. Subsequently, the calculated uric acid concentration is displayed on the display. The calculated uric acid concentration may be transmitted via the wireless communicator to the external device configured as a computer.

(3) Configuration of Electrode for Electrochemical Sensor

Explanation will be given for the electrode for electrochemical sensor according to the present embodiment, with reference to FIG. 2 and FIG. 3. An electrode 200 for electrochemical sensor (hereafter also referred to as "electrode 200") according to the present embodiment can be suitably used as the working electrode 11 in the above-mentioned sensor 100. Hereafter, explanation will be given for an example in which the electrode 200 is used as the above-mentioned working electrode 11.

Figure 2:
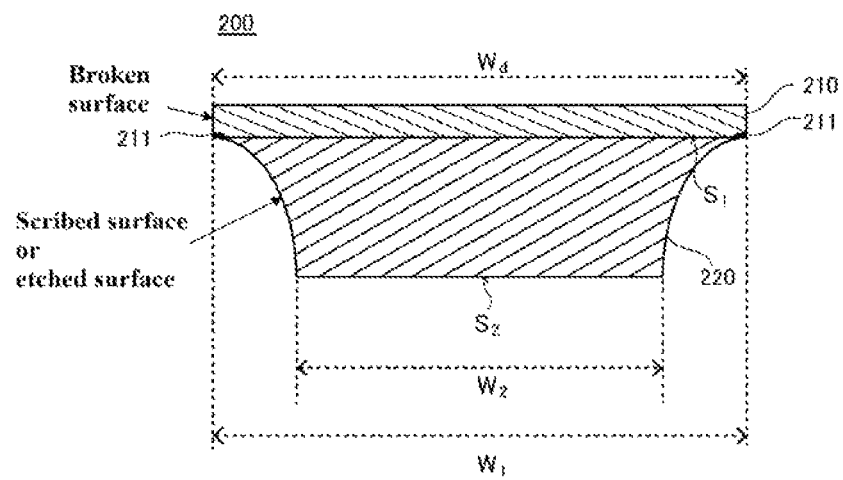
FIG. 2 is a view illustrating an example of a cross-sectional structure of an electrode for electrochemical sensor according to the embodiment of the present disclosure.

As illustrated in FIG. 2, the electrode 200 includes a diamond film 210 and a support 220 that supports the diamond film 210, the diamond film 210 generating the redox reaction of uric acid on a surface thereof when applying a predetermined voltage to the electrode 200 in contact with urine. In the above-mentioned sensor 100, the electrode 200 is arranged on the support member 20 so that urine is supplied from the diamond film 210 side, that is, so that the diamond film 210 comes into contact with the above-mentioned water absorption member 40.

The diamond film 210 is a poly-crystal film. The diamond film 210 preferably contains an element such as boron (B) at a concentration of, for example, $1\times10^{19}$ $cm^{-3}$ or more and $1\times10^{22}$ $cm^{-3}$ or less. B-concentration in the diamond film 210 can be measured, for example, by a secondary ion mass spectrometry (SIMS). The diamond film 210 can be grown (synthesized) using a Chemical Vapor Deposition (CVD) method such as a thermal filament (hot filament) CVD method, a plasma CVD method; a Physical Vapor Deposition (PVD) method such as an ion beam method, an ionized deposition method; or the like. In the growth of the diamond film 210 using the thermal filament CVD method, as the filament, a tungsten filament can be used, for example. The diamond film 210 may have a thickness of, for example, 0.5 µm or more and 10 µm or less, preferably 2 µm or more and 4 µm or less.

A side surface of the diamond film 210 has a broken surface generated by breaking the diamond film 210 along concave grooves 222 mentioned later in a production of the electrode 200.

In the diamond film 210, an alteration layer 211 is formed at an edge of a surface in contact with the support 220. In the diamond film 210, the alteration layer 211 is preferably formed over an entire periphery of the edge of the surface in contact with the support 220. The term "alteration layer" used herein refers to a layer formed by alteration (denaturation) of the diamond film 210 (crystal structure of diamond). For example, the alteration layer 211 refers to a layer formed as a result of a change of $SP^3$-bonds to $SP^2$-bonds in the diamond film 210 (i.e., a layer formed as a result of a graphitization of the diamond film 210) due to a laser irradiation, a layer formed as a result of an alteration of the diamond film 210 due to a mechanical machining, a bringing into contact with an etching liquid, a plasma irradiation, an ion beam irradiation, or the like.

The support 220 is formed using a material (dissimilar material) different from diamond. As the support 220, a single-crystal silicon (Si) substrate can be used, for example. As the support 220, poly-crystal, a Si-substrate, a silicon carbide (SiC) substrate, or a metal substrate formed of a metal material such as stainless steel (SUS) can also be used. The support 220 may have a thickness of, for example, 200 µm or more and 1000 µm or less.

The support 220 is configured so that when the electrode 200 (a stack including the diamond film 210 and the support 220) is viewed laterally, in the support 220, a width $W_2$ of a surface (hereafter also referred to as "second surface") $S_2$ opposite to a surface in contact with the diamond film 210 is smaller than a width $W_d$ of the diamond film 210 ($W_2 < W_d$). That is, the support 220 has a side surface in which the width $W_2$ of the second surface $S_2$ is smaller than the width $W_d$ of the diamond film 210. Since the support 220 has the above-mentioned configuration, a plane area of the second surface $S_2$ of the support 220 is smaller than a plane area of the diamond film 210.

When the electrode 200 is viewed laterally, in the support 220, the width $W_2$ of the second surface $S_2$ is preferably smaller than a width $W_1$ of a surface (hereafter also referred to as "first surface") $S_1$ in contact with the diamond film 210. That is, the plane area of the second surface $S_2$ is preferably smaller than a plane area of the first surface $S_1$.

When the electrode 200 is viewed laterally, the width $W_1$ of the first surface $S_1$ is preferably substantially equal to the width $W_d$ of the diamond film 210. A case of using the term "substantially equal to" includes, in addition to a case where the width $W_1$ of the first surface $S_1$ is exactly the same as the width $W_d$ of the diamond film 210, a case where a difference between these widths is within 100 µm. More preferably, the width $W_1$ of the first surface $S_1$ is slightly smaller than the width $W_d$ of the diamond film 210.

Figure 3:
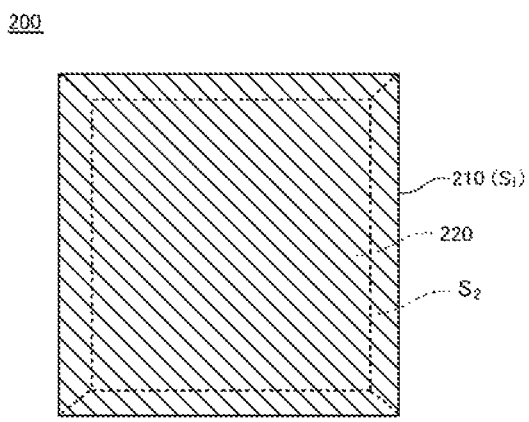
FIG. 3 is a view illustrating an example of a planar structure of the electrode for electrochemical sensor illustrated in FIG. 2.

As illustrated in a planar view (top view) of the electrode 200 in FIG. 3, the first surface $S_1$ and the second surface $S_2$ are, for example, square in planar shape, and the support 220 has four side surfaces. All four side surfaces of the support 220 preferably have the above-mentioned configuration. That is, for all side surfaces of the support 220, the width $W_2$ of the second surface $S_2$ is preferably smaller than the width $W_d$ of the diamond film 210, and more preferably smaller than the width $W_d$ of the diamond film 210 and the width $W_1$ of the first surface $S_1$.

Each side surface of the support 220 is an inclined surface that is gradually and gently curved from the first surface $S_1$ to the second surface $S_2$. Each side surface of the support 220 may be a flat inclined surface, for example.

As illustrated in FIG. 2, the side surface of the support 220 has at least one selected from a group of a scribed surface and an etched surface, generated by forming the concave grooves 222 mentioned later in the production of the electrode 200. The side surface of the support 220 preferably comprises (consists of) at least one selected from a group of the scribed surface and the etched surface.

The concave grooves 222 can be formed using a known method such as laser machining, mechanical machining, or etching. The term "scribed surface" used herein refers to a surface, for example, including a molten surface (laser machined surface) formed by performing laser scribing (laser machining), or a cut surface (mechanical machined surface) formed by performing scribing (mechanical machining) using a diamond scriber or the like. The term "etched surface" used herein refers to a surface formed by wet etching, or etching using plasma or ion beam.

As illustrated in FIG. 3, when the electrode 200 is viewed from the diamond film 210 side, it is preferable that the support 220 does not protrude from an outer periphery of the diamond film 210. That is, it is preferable that an outer periphery of the second surface $S_2$ of the support 220 is located inside an outer periphery of the first surface $S_1$ (diamond film 210), and the outer periphery of the first surface $S_1$ overlaps or is located inside the outer periphery of the diamond film 210. FIG. 3 illustrates an example in which the outer periphery of the first surface $S_1$ overlaps the outer periphery of the diamond film 210. In addition, it is more preferable that a center position of the first surface $S_1$, a center position of the second surface $S_2$, and a center position of the diamond film 210 coincide in a thickness direction of the electrode 200.

(4) Method of Manufacturing Electrode for Electrochemical Sensor

Explanation will be given for a method of manufacturing the electrode for electrochemical sensor according to the present embodiment 200, with reference to FIG. 4 and FIG. 5.

(Step of Preparing Substrate)

First, a substrate (disk-shaped substrate) 220A is prepared which is formed of a material (dissimilar material) different from diamond, and has, for example, a circular outline in a planar view. For example, a disk-shaped substrate 220A comprising a single-crystal Si is prepared. The substrate 220A corresponds to the support 220 in the electrode 200.

After the substrate 220A is prepared, one main surface (hereafter also referred to as "first main surface 221") of two main surfaces of the substrate 220A is subjected to a seeding process, a scratching process, or the like. The seeding process refers to a process of attaching diamond grains onto the first main surface 221 of the substrate 220A by applying a solution (dispersion liquid) on the first main surface 221, or by immersing the substrate 220A in the dispersion liquid, the dispersion liquid being a liquid in which the diamond grains of, for example, about several nanometers to several tens micrometers disperse therein. The scratching process refers to a process of making scratches on the first main surface 221 using diamond abrasive grains (diamond powder) of about several micrometers, or the like. Thereby, the diamond film 210 can be grown on the substrate 220A.

(Step of Growing Diamond Film (Step of Producing Stack))

After the substrate 220A is prepared, the diamond film 210 is grown on the first main surface 221 of the substrate 220A, for example, by the thermal filament CVD method using the tungsten filament.

Figure 4:
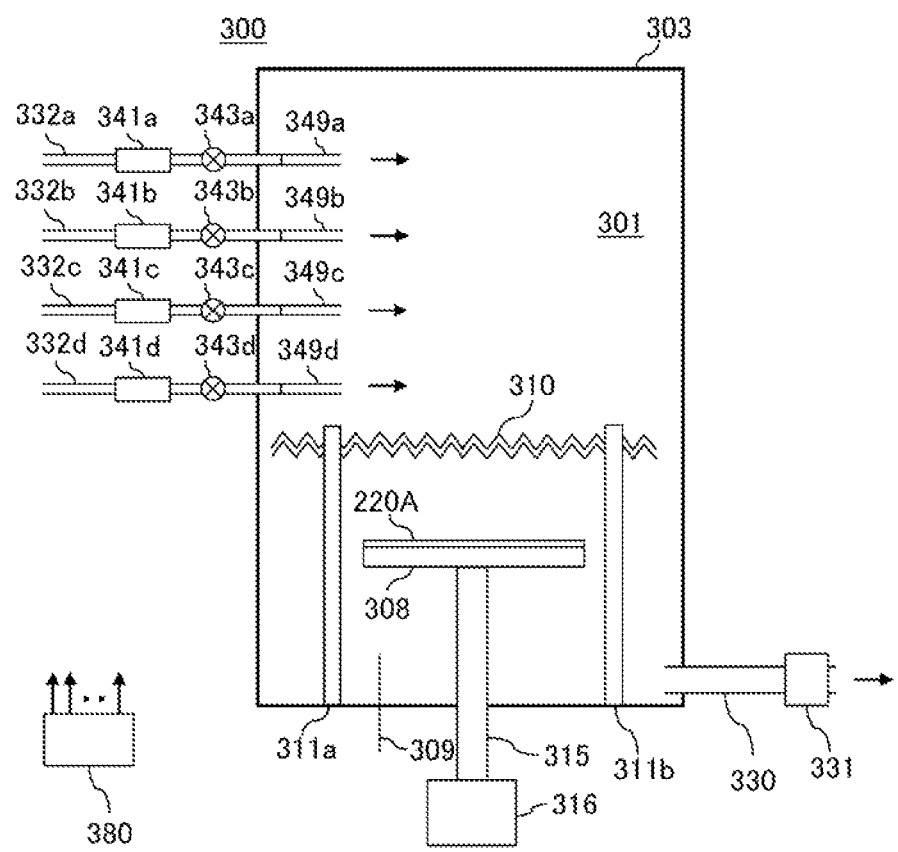
FIG. 4 is a schematic view of a vapor phase deposition apparatus used to grow a diamond film.

The diamond film 210 can be grown, for example, using a thermal filament CVD apparatus 300 illustrated in FIG. 4. The thermal filament CVD apparatus 300 includes an airtight container 303 which comprises a heat-resistant material such as quartz and in which a growth chamber 301 is constructed. A susceptor 308 for holding the substrate 220A is provided in the growth chamber 301. The susceptor 308 is connected to a rotation shaft 315 included in a rotation mechanism 316, and is rotatably configured. To a sidewall of the airtight container 303 are connected a gas supply pipe 332a for supplying nitrogen ($N_2$) gas into the growth chamber 301, a gas supply pipe 332b for supplying hydrogen ($H_2$) gas, a gas supply pipe 332c for supplying methane ($CH_4$) gas or ethane ($C_2H_6$) gas as a carbon-containing gas, and a gas supply pipe 332d for supplying trimethylboron ($B(CH_3)_3$, abbreviated as TMB) gas, trimethyl borate ($B(OCH_3)_3$) gas, triethyl borate ($B(C_2H_5O)_3$) gas, or diborane ($B_2H_6$) gas as a boron-containing gas. To the gas supply pipes 332a to 332d are respectively provided flowrate controllers 341a to 341d and valves 343a to 343d in order from the upstream side of the gas flow. To downstream ends of the gas supply pipes 332a to 332d are respectively connected nozzles 349a to 349d for supplying gas supplied through the gas supply pipes 332a to 332d into the growth chamber 301. To another sidewall of the airtight container 303 is provided an exhaust pipe 330 for exhausting the growth chamber 301. To the exhaust pipe 330 is provided a pump 331. In the airtight container 303 is provided a temperature sensor 309 for measuring a temperature in the growth chamber 301. In the airtight container 303 are provided a tungsten filament 310, and a pair of electrodes (e.g., copper electrodes) 311a, 311b for heating the tungsten filament 310. Each member included in the thermal filament CVD apparatus 300 is connected to a controller 380 configured as a computer, and is configured so that processing procedures and processing conditions mentioned later are controlled with a program executed on the controller 380.

The diamond film 210 is grown using the above-mentioned thermal filament CVD apparatus, for example, according to the following processing procedures. First, the substrate 220A is loaded (installed) in the airtight container 303, and held on the susceptor 308. Then, $H_2$-gas (or a mixed gas of $N_2$-gas and $H_2$-gas) is supplied into the growth chamber 301 while exhausting the growth chamber 301. A current is flowed between the electrodes 311a and 311b to start heating of the tungsten filament 310. As the tungsten filament 310 is heated, the substrate 220A held on the susceptor 308 is also heated. After the tungsten filament 310 reaches a desired temperature, and a pressure in the growth chamber 301 reaches a desired growth pressure, and an atmosphere in the growth chamber 301 becomes a desired atmosphere, $CH_4$-gas and TMB-gas are supplied into the growth chamber 301. As $CH_4$-gas and TMB-gas supplied into the growth chamber 301 pass through the tungsten filament 310 heated to an elevated temperature, they are decomposed (thermally decomposed) to generate active species such as methyl radicals ($CH_3^*$). As these active species and the like are supplied on the substrate 220A, the diamond film grows.

The following conditions are exemplified as the conditions for growing the diamond film 210.

Figure 5A:
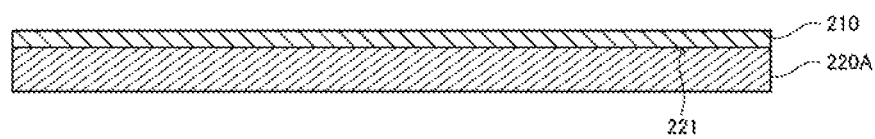
FIG. 5(*a*) is a cross-sectional view illustrating a stack including the diamond film and a substrate, FIG. 5(*b*) is a cross-sectional view illustrating a state where concave grooves (scribed grooves) are formed on a rear surface of the stack illustrated in FIG. 5(*a*), and FIG. 5(*c*) is a schematic view illustrating how the diamond film is broken along the concave grooves to obtain the electrode for electrochemical sensor.

Substrate temperature: 600° C. or more and 1000° C. or less, preferably, 650° C. or more and 800° C. or less Filament temperature: 1800° C. or more and 2500° C. or less, preferably, 2000° C. or more and 2200° C. or less Pressure in growth chamber: 5 Torr or more and 50 Torr or less, preferably 10 Torr or more and 35 Torr or less Ratio of partial pressure of $CH_4$-gas relative to partial pressure of TMB-gas (TMB/$CH_4$): 0.003% or more and 0.8% or less Ratio of $H_2$-gas relative to $CH_4$-gas ($CH_4/H_2$): 2% or more and 5% or less Thereby, there is produced a stack 230 including the substrate 220A and the diamond film 210 illustrated in a schematic cross-sectional view in FIG. 5(a). When the diamond film 210 is grown on the substrate 220A formed of a material different from diamond, the grown diamond film 210 is a poly-crystal diamond film. Further, when the diamond film 210 is grown under the above-mentioned conditions, the thickness of the diamond film 210 becomes, for example, 0.5 μm or more and 10 μm or less, preferably 2 μm or more and 4 μm or less, and the B-concentration in the diamond film 210 becomes, for example, $1\times10^{19}$ cm$^{-3}$ or more and $1\times10^{22}$ cm$^{-3}$ or less.

(Step of Forming Concave Grooves)

Figure 5B:
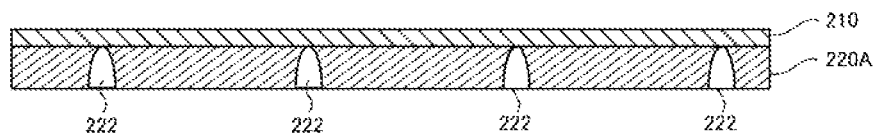

After the growth of the diamond film 210 is completed, the concave grooves 222 (e.g., scribed grooves) are formed from a rear surface side of the stack 230 (a main surface side opposite to the first main surface 221 of the substrate 220A), as illustrated in FIG. 5(b). The concave grooves 222 can be formed, for example, by laser scribing. The concave grooves 222 are provided so as to penetrate the substrate 220A in the thickness direction and reach the diamond film 210. Thereby, in the diamond film 210, a surface in contact with the substrate 220A is also irradiated with a laser. Therefore, in the diamond film 210, the alteration layer 211 is formed on the surface in contact with the substrate 220A.

(Step of Breaking Diamond Film)

Figure 5C:
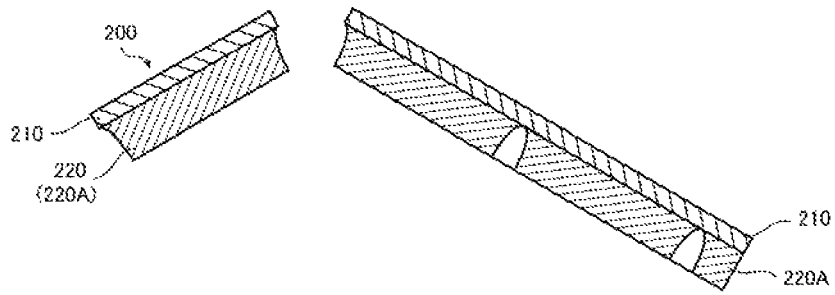

After the concave grooves 222 are formed, the diamond film 210 is broken along the concave grooves 222, as illustrated in FIG. 5(c). In this event, the diamond film 210 is preferably bent outward along the concave grooves 222 to break. Thereby, there can be obtained the above-mentioned electrode 200 including the diamond film 210 and the support 220.

(5) Effect Obtained According to the Present Embodiment

According to the present embodiment, one or more of the following effects can be obtained.

Figure 6:
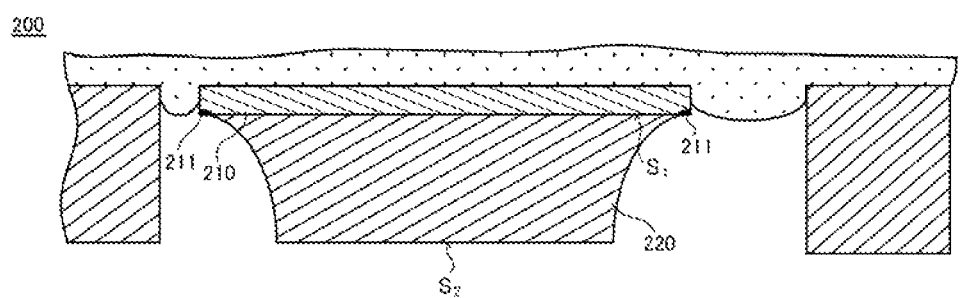
FIG. 6 is a cross-sectional view schematically illustrating an example of a main part while a water absorption member absorbs and retains a liquid test sample.

(a) Since the electrode 200 including the support 220 in which the width $W_2$ of the surface (second surface $S_2$) opposite to the surface in contact with the diamond film 210 is smaller than the width $W_d$ of the diamond film 210, is used as the working electrode 11 of the electrochemical sensor unit 100, urine is less likely to come into contact with (attach to) the side surface of the support 220 when the urine is supplied from the diamond film 210 side. For example, as illustrated in FIG. 6, even when urine is supplied to the sensor 100, and the water absorption member 40 absorbs and retains the urine and swells, the water absorption member 40 is less likely to come into contact with the side surface of the support 220. Therefore, it is possible to suppress the generation of the unintended redox reaction on the side surface of the support 220. Thereby, it is possible to suppress a current flowing through the working electrode 11 from being mixed with a current other than a current generated by the redox reaction of uric acid. For example, only the current generated by the redox reaction of uric acid can be the current flowing through the working electrode 11. As a result, a sensor performance of the electrochemical sensor unit 100 can be improved.

(b) Since the electrode 200 in which urine is less likely to come into contact with the side surface of the support 220 as mentioned above is used as the working electrode 11, it is not necessary to provide a layer for preventing urine from contacting with the side surface of the support 220.

(c) Since the outer periphery of the first surface $S_1$ of the support 220 overlaps or is located inside the outer periphery of the diamond film 210, it is possible to suppress urine from coming into contact with the first surface $S_1$ of the support 220 when the urine comes into contact with the working electrode 11 through the water absorption member 40. As a result, it is possible to suppress the generation of the unintended redox reaction on the first surface $S_1$ of the support 220. Thereby, it is possible to reliably suppress the current flowing through the working electrode 11 from being mixed with a current other than a current generated by the redox reaction of uric acid. Therefore, the sensor performance of the electrochemical sensor unit 100 can be reliably improved.

(e) The electrode 200 is produced by growing the diamond film 210 on the first main surface 221 of substrate 220A to produce the stack 230, then forming the concave grooves 222 from the rear surface side of the stack 230, and breaking the diamond film 210 along the concave grooves 222. As a result, it is possible to suppress the diamond film 210 from being peeled from the substrate 220A when the diamond film 210 is broken. For example, in the produced electrode 200, an area of the diamond film 210 peeled from the support 220 can be, for example, 5% or less. Thereby, a life of the electrode 200 can be extended, and the sensor performance of the electrochemical sensor unit 100 using the electrode 200 can be improved.

(f) Further, by producing the electrode 200 according to the above-mentioned procedure, the electrode 200 having a predetermined shape can be easily produced even when the electrode 200 includes the diamond film 210 having a high hardness.

It is also conceivable to form the concave grooves 222 from a front surface side (the diamond film 210 side) of the stack 230 including the substrate 220A and the diamond film 210. However, since the diamond film 210 is a very hard film, it is difficult to form the concave grooves 222 from the diamond film 210 side by laser machining or mechanical machining. Therefore, in this case, it is difficult to produce the electrode 200 having a predetermined shape.

(g) In the production of the electrode 200, by forming the concave grooves 222 so as to penetrate the substrate 220A in the thickness direction to reach the diamond film 210, the alteration layer 211 can be formed on the surface in contact with the substrate 220A of the diamond film 210. Since the alteration layer 211 has a lower hardness and is more fragile compared to the diamond film 210, a breakage controllability of the diamond film 210 can be improved by forming the alteration layer 211. For example, when the diamond film 210 is broken, the diamond film 210 can be easily and accurately broken.

(6) Modified Example

The above-mentioned embodiment can be modified as in the following modified example.

Figure 7:
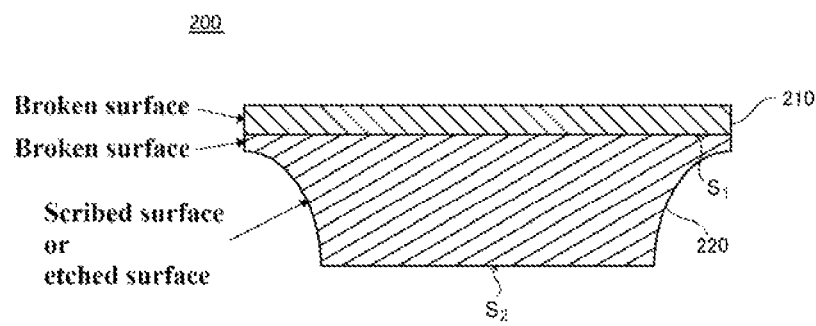
FIG. 7 is a view illustrating an example of a cross-sectional structure of the electrode for electrochemical sensor according to a modified example of the embodiment of the present disclosure.

As illustrated in FIG. 7, in the electrode 200, the broken surface may be formed on the side surface of the support 220 closer to the surface (first surface $S_1$) in contact with the diamond film 210. That is, the side surface of the support 220 may have at least one selected from a group of the scribed surface and the etched surface generated by forming the concave grooves 222, and may also have the broken surface generated by breaking the substrate 220A along the concave grooves 222. The broken surface of the support 220 may include a cleaved surface. In the present modified example, the alteration layer 211 is not formed on the surface in contact with the support 220 in the diamond film 210. Such an electrode 200 can be produced by forming the concave grooves 222 so as not to penetrate the substrate 220A in the thickness direction (so as not to reach the diamond film 210) in the above-mentioned formation of the concave grooves. In this case, the concave grooves 222 are preferably formed so that a thickness of the thinnest part of the substrate 220A is, for example, 10 μm or more and 80 μm or less. Thereby, a reduction in the breakage controllability of the diamond film 210 can be suppressed while suppressing a formation of the alteration layer 211.

In the present modified example, since the alteration layer 211 is not formed on the diamond film 210, an adhesion between the support 220 and the diamond film 210 can be enhanced, as compared to a case where the alteration layer 211 is formed. Therefore, a life of the electrode 200 can be further extended, and the sensor performance of the sensor 100 using the electrode 200 can be reliably improved. Further, since the alteration layer 211 is not formed, variations in quality (e.g., electrical characteristics) of the diamond film 210 among a plurality of electrodes 200, can also be suppressed.

Other Embodiments

Explanations have been given specifically for the embodiment of the present disclosure. However, the present disclosure is not limited to the above-mentioned embodiment, and can be variously modified in a range not departing from the gist of the disclosure.

In the above-mentioned embodiment, explanation has been given for a case where the uric acid concentration in urine as a liquid test sample is measured, but the present disclosure is not limited thereto. The liquid test sample may be, in place of urine, blood, tear, snivel, saliva, sweat, or the like. The detected component may be a component other than uric acid. By appropriately changing the conditions of cyclic voltammetry, the concentrations of various components (substances) in the liquid test sample can be measured.

A predetermined enzyme corresponding to the detected component may be applied on the diamond film 210, the detected component such as uric acid and the enzyme may be electrochemically reacted, and the concentration of the detected component may be calculated.

In the above-mentioned embodiment, explanation has been given for a case where the concentration of the predetermined component in the liquid test sample is measured by the three-electrode method, but the present disclosure is not limited thereto. For example, the concentration of the predetermined component in the liquid test sample may be measured by a two-electrode method. In this case, the sensor 100 may have structures similar to those in the above-mentioned embodiment except that the reference electrode 13 and the third wiring 33 are not provided.

In the above-mentioned embodiment, explanation has been given for a case where the test sample is supplied to the surface of the electrode group 10 through the water absorption member 40, but the present disclosure is not limited thereto. For example, the sensor 100 does not have to include the water absorption member 40, and may be configured so that the test sample is directly supplied to the surface of the electrode group 10. In this case, the test sample may be a mist-like test sample, in place of the liquid test sample.

In the above-mentioned embodiment, explanation has been given for a case where the sensor 100 include one electrode group 10, but the sensor 100 may include a plurality of the electrode groups 10. When a plurality of the electrode groups 10 are included, the first to third wirings 31 to 33 are connected to each of the electrodes.

In the above-mentioned embodiment, explanation has been given for a case where the first surface $S_1$ and the second surface $S_2$ of the support 220 are square in planar shape, but the present disclosure is not limited thereto. The first surface $S_1$ and the second surface $S_2$ of the support 220 may be, for example, rectangular other than square, or circular, in planar shape. In the above-mentioned embodiment, explanation has been given for a case where the first surface $S_1$ and the second surface $S_2$ are similar in planar shape, but the present disclosure is not limited thereto. The first surface $S_1$ and the second surface $S_2$ may be non-similar. For example, the first surface $S_1$ of the support 220 may be circular in planar shape, and the second surface $S_2$ of the support 220 may be square in planar shape.

Preferable Aspects of the Present Disclosure

Preferable aspects of the present disclosure will be supplementarily described hereafter.

(Supplementary Description 1)

According to an aspect of the present disclosure, there is provided an electrochemical sensor unit, including:
a working electrode; and
a counter electrode,
wherein the working electrode includes a diamond film which generates a redox reaction on a surface when a voltage is applied between the working electrode and the counter electrode, and a support which is formed of a material different from diamond and supports the diamond film,
when the working electrode is viewed laterally, in the support, a width of a surface opposite to a surface in contact with the diamond film is smaller than a width of the diamond film, and
a liquid test sample is supplied to the working electrode from the diamond film side.

(Supplementary Description 2)

According to another aspect of the present disclosure, there is provided an electrochemical sensor unit, including:
a working electrode; and
a counter electrode,
wherein the working electrode includes a diamond film which generates a redox reaction on a surface when a voltage is applied between the working electrode and the counter electrode, and a support which is formed of a material different from diamond and supports the diamond film,
in the support, a plane area of a surface opposite to a surface in contact with the diamond film is smaller than a plane area of the diamond film, and
a liquid test sample is supplied to the working electrode from the diamond film side.

(Supplementary Description 3)

Preferably, there is provided the sensor unit according to the supplementary description 1 or 2,
wherein when the working electrode is viewed from the diamond film side, in the support, an outer periphery of the surface opposite to the surface in contact with the diamond film is located inside an outer periphery of the diamond film, and
an outer periphery of the surface in contact with the diamond film overlaps or is located inside the outer periphery of the diamond film.

(Supplementary Description 4)

Preferably, there is provided the sensor unit according to any one of the supplementary descriptions 1 to 3,
wherein in the support, a side surface has at least one selected from a group of a scribed surface and an etched surface generated by forming concave grooves on the surface opposite to the surface in contact with the diamond film, and
a side surface of the diamond film has a broken surface generated by breaking the diamond film along the concave grooves.

(Supplementary Description 5)

Preferably, there is provided the sensor unit according to the supplementary description 4,
wherein the side surface of the support comprises (consists of) one of the scribed surface and the etched surface.

(Supplementary Description 6)

Preferably, there is provided the sensor unit according to the supplementary description 5,
wherein in the diamond film, an alteration layer is formed at an edge of a surface in contact with the support.
Preferably, in the diamond film, the alteration layer is formed over an entire periphery of the edge of the surface in contact with the support.

(Supplementary Description 7)

Preferably, there is provided the sensor unit according to the supplementary description 4,
wherein a broken surface generated by breaking the support along the concave grooves is formed on the side surface of the support closer to the surface in contact with the diamond film.

(Supplementary Description 8)

Preferably, there is provided the sensor unit according to the supplementary description 7,
wherein in the diamond film, an alteration layer is not formed on a surface in contact with the support.

(Supplementary Description 9)

Preferably, there is provided the sensor unit according to the supplementary descriptions 1 to 8,
wherein the support comprises a single-crystal silicon or a poly-crystal silicon.

(Supplementary Description 10)

According to further another aspect of the present disclosure, there is provided an electrode for electrochemical sensor, including:
a diamond film which generates a redox reaction on a surface when a voltage is applied; and
a support which is formed of a material different from diamond and supports the diamond film, wherein when a stack including the diamond film and the support is viewed laterally, in the support, a width of a surface opposite to a surface in contact with the diamond film is smaller than a width of the surface in contact with the diamond film, and a liquid test sample is supplied from the diamond film side of the stack.

(Supplementary Description 11)

According to further another aspect of the present disclosure, there is provided a method of manufacturing an electrode for electrochemical sensor, including:

preparing a substrate comprising a material different from diamond;

producing a stack by forming (depositing) a diamond film on one of two main surfaces of the substrate;

forming concave grooves of a predetermined shape on a main surface of the substrate, the main surface being opposite to a main surface on which the diamond film is formed; and breaking the diamond film along the concave grooves.

(Supplementary Description 12)

Preferably, there is provided the method according to the supplementary description 11, wherein in the formation of the concave grooves, the concave grooves are formed so as to reach the diamond film.

(Supplementary Description 13)

Preferably, there is provided the method according to the supplementary description 11, wherein in the formation of the concave grooves, the concave grooves are formed so as not to reach the diamond film.

(Supplementary Description 14)

Preferably, there is provided the method according to any one of the supplementary descriptions 11 to 13, wherein in the breaking of the diamond film, the diamond film is bent outward along the concave grooves to break.

DESCRIPTION OF SIGNS AND NUMERALS

100 Electrochemical sensor unit
11 Working electrode
200 Electrode for electrochemical sensor
210 Diamond film
220 Support

What is claimed is:

1. An electrochemical sensor unit, comprising:
a working electrode; and
a counter electrode,
wherein the working electrode includes a diamond film which generates a redox reaction on a surface when a voltage is applied between the working electrode and the counter electrode, and a support which is formed of a material different from diamond and supports the diamond film,
when the working electrode is viewed laterally, in the support, a width of a second surface opposite to a first surface in contact with the diamond film is smaller than a width of the diamond film,
the first surface is a planar surface,
the diamond film is provided only on the first surface,
in the diamond film, a surface opposite to a surface in contact with the support is a planar surface,
when the working electrode is viewed laterally, side surfaces of the support are exposed, and a liquid test sample is supplied to the working electrode from the diamond film side.

2. The electrochemical sensor unit according to claim 1,
wherein when the working electrode is viewed from the diamond film side, in the support, an outer periphery of the second surface opposite to the first surface in contact with the diamond film is located inside an outer periphery of the diamond film, and
an outer periphery of the first surface in contact with the diamond film overlaps or is located inside the outer periphery of the diamond film.

3. The electrochemical sensor unit according to claim 1,
wherein when the working electrode is viewed laterally, in the support, each of the side surfaces has a concave grooves on the second surface opposite to the first surface in contact with the diamond film, and
a side surface of the diamond film has a broken surface generated by breaking the diamond film along the concave grooves.

4. The electrochemical sensor unit according to claim 3,
wherein each of the side surfaces of the support comprises one of the scribed surface and the etched surface.

5. The electrochemical sensor unit according to claim 3,
wherein the broken surface generated by breaking the support along the concave grooves is formed on the side surface of the support closer to the surface in contact with the diamond film.

6. An electrode for electrochemical sensor, comprising:
a diamond film which generates a redox reaction on a surface when a voltage is applied; and
a support which is formed of a material different from diamond and supports the diamond film,
wherein when a stack including the diamond film and the support is viewed laterally, in the support, a width of a second surface opposite to a first surface in contact with the diamond film is smaller than a width of the surface in contact with the diamond film,
the first surface is a planar surface,
the diamond film is provided only on the first surface,
in the diamond film, a surface opposite to a surface in contact with the support is a planar surface,
when the stack including the diamond film and the support is viewed laterally, side surfaces of the support are exposed, and
a liquid test sample is supplied from the diamond film side of the stack.

7. A method of manufacturing an electrode for electrochemical sensor, comprising:
preparing a substrate comprising a material different from diamond;
producing a stack by forming a diamond film on one of two main surfaces of the substrate;
forming concave grooves of a predetermined shape on a main surface of the substrate, the main surface being opposite to a main surface on which the diamond film is formed; and
breaking the diamond film along the concave grooves.

8. The method of manufacturing the electrode for electrochemical sensor according to claim 7,
wherein in the formation of the concave grooves, the concave grooves are formed so as to reach the diamond film.

9. The method of manufacturing the electrode for electrochemical sensor according to claim 7,
wherein in the formation of the concave grooves, the concave grooves are formed so as not to reach the diamond film.

10. The method of manufacturing the electrode for electrochemical sensor according to claim 7,
wherein in the breaking of the diamond film, the diamond film is bent outward along the concave grooves to break.

\* \* \* \* \*